(12) United States Patent
Laine et al.

(10) Patent No.: US 10,297,590 B1
(45) Date of Patent: May 21, 2019

(54) ELECTRO-STATIC DISCHARGE PROTECTION DEVICE AND METHOD OF MAKING

(71) Applicant: NXP USA, Inc., Austin, TX (US)

(72) Inventors: Jean-Philippe Laine, Saint Lys (FR); Jiang-kai Zuo, Chandler, AZ (US); Ronghua Zhu, Chandler, AZ (US); Patrice Besse, Tournefeuille (FR); Rouying Zhan, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 2 days.

(21) Appl. No.: 15/864,108

(22) Filed: Jan. 8, 2018

(30) Foreign Application Priority Data

Dec. 15, 2017 (EP) .................................... 17306785

(51) Int. Cl.

| | |
|---|---|
| *H01L 23/50* | (2006.01) |
| *H01L 27/02* | (2006.01) |
| *H01L 29/10* | (2006.01) |
| *H01L 29/08* | (2006.01) |
| *H02H 9/04* | (2006.01) |
| *H01L 29/423* | (2006.01) |
| *H01L 29/66* | (2006.01) |
| *H01L 29/78* | (2006.01) |
| *H01L 29/36* | (2006.01) |

(52) U.S. Cl.
CPC .......... *H01L 27/0277* (2013.01); *H01L 23/50* (2013.01); *H01L 29/0847* (2013.01); *H01L 29/1033* (2013.01); *H01L 29/36* (2013.01); *H01L 29/42372* (2013.01); *H01L 29/6656* (2013.01); *H01L 29/66659* (2013.01); *H01L 29/7835* (2013.01); *H02H 9/046* (2013.01)

(58) Field of Classification Search
CPC ...................................................... H01L 23/62
See application file for complete search history.

(56) References Cited

U.S. PATENT DOCUMENTS

| 6,873,017 | B2 * | 3/2005 | Cai ..................... H01L 29/7833 257/355 |
|---|---|---|---|
| 9,449,960 | B2 | 9/2016 | Wen et al. |
| 9,559,170 | B2 | 1/2017 | Stribley |
| 2005/0051848 | A1 * | 3/2005 | Ker ................. H01L 21/823814 257/356 |

* cited by examiner

*Primary Examiner* — Fernando L Toledo
*Assistant Examiner* — Valerie N Newton (57) ABSTRACT

The present disclosure teaches a Field-Effect Transistor (FET) configured as a diode to provide ESD protection. The field-effect transistor has its gate, source, and body connected to a common power supply rail. A low-density doped drain region extends in a length direction beyond the gate sidewall spacers of the transistor to provide a lower leakage current than would otherwise be exhibited by the protection device.

19 Claims, 5 Drawing Sheets

ELECTRO-STATIC DISCHARGE PROTECTION DEVICE AND METHOD OF MAKING

CROSS REFERENCE TO RELATED APPLICATION(S)

The present application claims priority to European Application No. EP 17306785.1, entitled "ELECTRO-STATIC DISCHARGE PROTECTION DEVICE AND METHOD OF MAKING," filed on Dec. 15, 2017, the entirety of which is herein incorporated by reference.

FIELD OF THE DISCLOSURE

The present disclosure relates generally to semiconductor devices, and more particularly to a semiconductor device having electro-static discharge protection.

BACKGROUND

Electro-Static Discharge (ESD) into a semiconductor integrated circuit (IC) can cause failure of components of the IC unless they are properly ESD protected. ESD protection is normally achieved by making circuits having special components that reside in the input/output (IO) regions of the circuit. For example, standard low-voltage ESD clamps connected to a bond pad of an 10 region can provide good protection performance. However, with respect to low-power applications, conventional ESD clamps can poses significant leakage current characteristics, especially for application having a large number of IOs.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

The present disclosure teaches a Field-Effect Transistor (FET) configured as a diode to provide ESD protection. The field-effect transistor has its gate, source, and body connected to a common power supply rail. A low-density doped drain region extends in a length direction beyond the gate sidewall spacers of the transistor to provide a lower leakage current than would otherwise be exhibited by the protection device. A specific embodiment of such a field-effect transistor will be better understood with reference to FIGS. 1-10.

Figure 1:
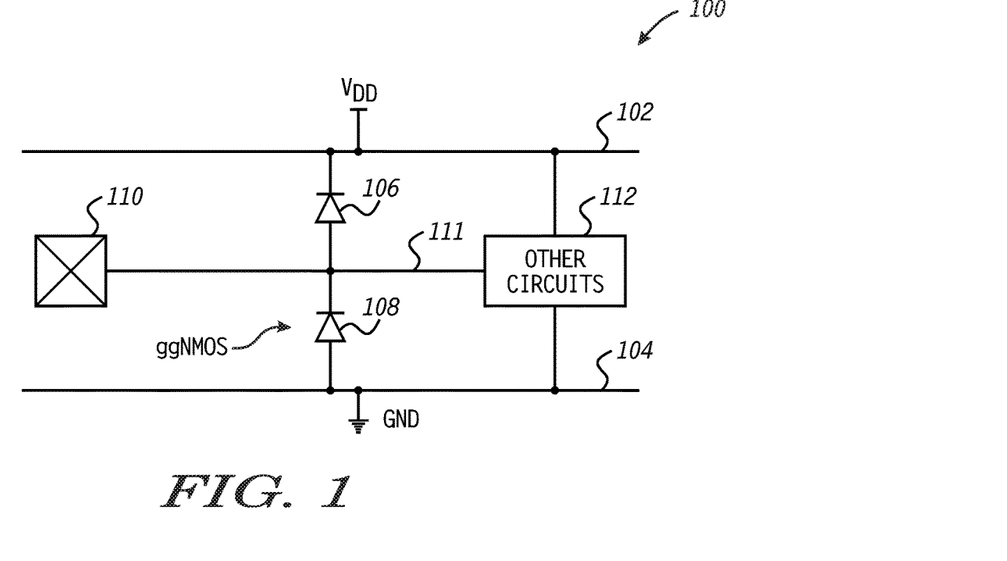
FIG. 1 illustrates a schematic diagram of a device having an integrated circuitry with protection device in accordance with a specific embodiment of the present disclosure.

FIG. 1 illustrates an electronic application device 100 implementing an 10 protection scheme. Device 100 includes a plurality of bond pads connected to other circuits 112, including a bond pad 110 that is specifically shown connected to diodes 106 and 108 via a signal line 111. The other circuits 112 are connected to a VDD power rail 102 and to a ground power rail 104, and provides various application functionality during operation. For example, the other circuits 112 will normally include transistors that operate at logic voltage levels to implement logic functions, and are, therefore, referred to as logic transistors. The diodes 106 and 108 are configured as 10 protection circuitry. Diode 106 has its cathode connected to the VDD power rail 102 and its anode connected to signal line 111. Diode 108 has its cathode connected to the signal line 111, and its anode connected to the ground power rail 104.

During operational mode, a data signal received at bond pad 110 has a voltage between ground and VDD. As such, the diodes 106 and 108 are reverse biased when the chip 100 is powered, and conduct primarily leakage current. However, the external terminals that are electrically connected to the plurality of bond pads, including bond pad 110, can be exposed to ESD events, which in turn are provided paths that reach other circuits.

If the bond pad 110 experiences an ESD event that exceeds the power supply voltage VDD, the upper diode 106 will forward bias to the VDD rail 102. Conversely, a negative voltage to the 10 will forward bias the lower diode 108 to the ground rail 104. Hence the voltage level at conductive line 111 is clamped within a voltage range which can be tolerated by the rest of the circuit, i.e. between 0 Volts (V) and VDD. If the VDD rail 102 is unconnected to a power source, however, a positive ESD event can reverse bias the diode 108 until it conducts due to reverse bias breakdown. A similar situation can occur for reverse polarity ESD pulses applied to the diode 106 if the ground 104 is disconnected.

Figure 2:
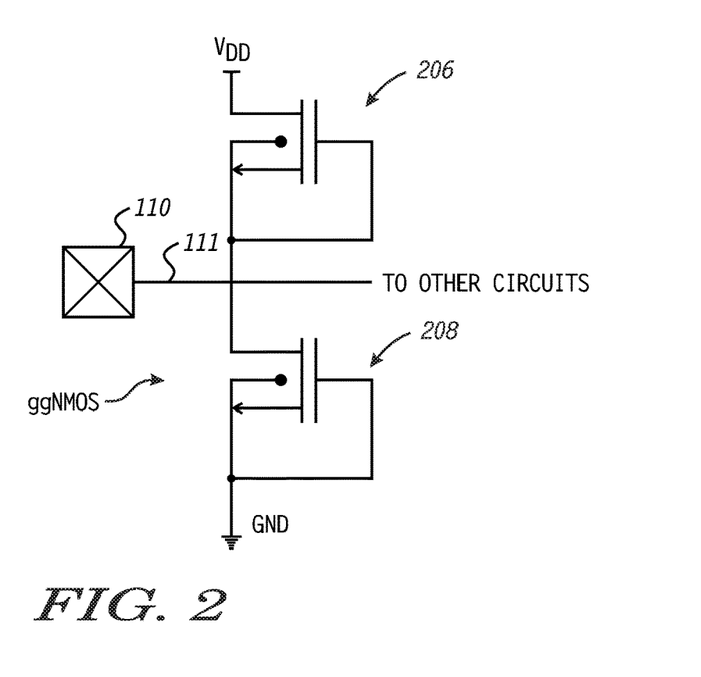
FIG. 2 illustrates a schematic representation of the protection device of FIG. 1.

Large FETs having their gate, source, and body nodes connected can be an effective n-type protection device for discharging ESD pulses by a combination of reverse bias breakdown of the drain to body diode and also by breakdown of the parasitic bipolar NPN junctions between source, body and drain. Input protection diodes may be implemented using large n-type FETs having their gate, source, and body nodes connected together to an anode terminal and their drain nodes connected to a cathode terminal. In a typical configuration, n-type FET transistors would be used where diodes 106 and 108 are shown in FIG. 1. FIG. 2 shows a schematic representation of n-type FETs 206 and 208 that are configured to implement a specific embodiment of the diodes 108 and 106. The gate, source, and body of the n-type FET 206 are connected together to the signal line 111, to which a signal that can vary between ground and VDD is applied during normal operation. The gate, source, and body of the n-type FET 208 are connected together to the ground power supply rail 104, to which ground is applied during operation.

This configuration of transistors 206 and 208 is commonly known as a ggNMOS (Grounded-Gate N-type Metal Oxide Semiconductor) configuration, or n-type ggFET configuration, and can be an effective n-type protection device for discharging ESD pulses by a combination of reverse bias breakdown of the drain to body diode and also by breakdown of the parasitic bipolar NPN junctions between source, body and drain. A particular embodiment of diode 108 implemented having an n-type ggNFET (ggNMOS) configuration that facilitates reduced leakage current over that conventional ggNMOS configurations will be better understood in reference to FIGS. 3-10.

Figure 3:
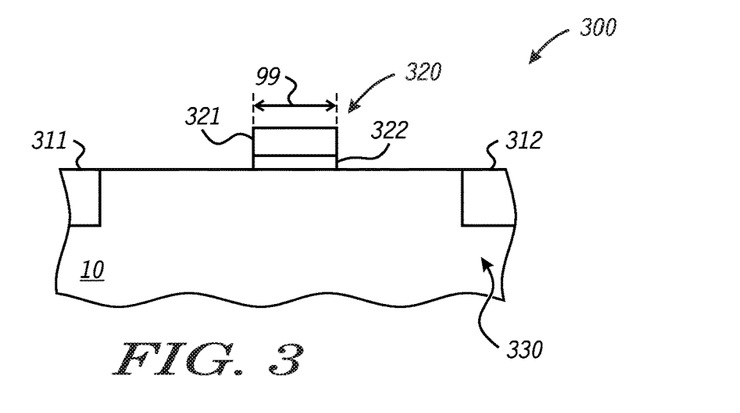
FIGS. 3-9 illustrate a location of a semiconductor die at various times during which the protection device of FIG. 2 is being formed.

FIG. 3 is a side view of a location 300 of a semiconductor die where a transistor having a ggNMOS configuration with improved leakage current characteristics is being formed. In particular, location 300 of FIG. 3 includes a portion of a substrate 10 of a larger semiconductor device at which a gate structure 320 has been formed overlying a body region 330. The illustrated portion of substrate 10 can be an upper-most portion of a bulk semiconductor substrate, an upper most portion of a semiconductor-on-insulator substrate, and the like. The body region 330 can include a Group 14 element having a particular conductivity type. By way of example, the body region 330 is presumed to have a p-doped conductivity type having a dopant concentration in the range of 1e14 to 1e17 atoms/cm^3.

A dielectric layer is formed at a surface of the semiconductor device that defines an active region 330 of the ggNMOS transistor being formed. Specifically illustrated at FIG. 3 are dielectric portions 311 and 312 of the dielectric layer at the left and right sides of active region 330, respectively. The dielectric layer can be formed using conventional and proprietary processes as are known in the industry, and therefore can include an oxygen, nitrogen, the like, and combinations thereof, as needed to isolate the active region 330 from adjacent regions for the purposes described herein. It will be appreciated that other isolation techniques can be used to electrically isolate the active region 330 from other device formed at substrate 10.

Gate structure 320 has a length dimension 99, and includes a conductive gate 321 and a gate dielectric 322. While a typical configuration for a ggNMOS protection device can include a plurality of long parallel gate fingers with alternate connections to the drain, source, and body regions for the purposes of increasing the size of the ggNMOS device, a transistor having a single gate finger is shown for ease of discussion. The dimension 99 can have a minimum dimension as defined by the critical dimensions for a particular process, or longer. By way of example, it is presumed the dimension 99 is about 0.13 um. Unless stated otherwise, the term "length" as used herein with respect to a transistor feature is intended to refer to a dimension as measured in the direction of current flow through a channel region of the transistor, the term "width" is intended to refer to a dimension as measured in the direction that is orthogonal the length dimension and parallel to a major surface of the substrate, and the term "depth" is intended to refer to a dimension as measured in the direction orthogonal the length and width dimensions.

Figure 4:
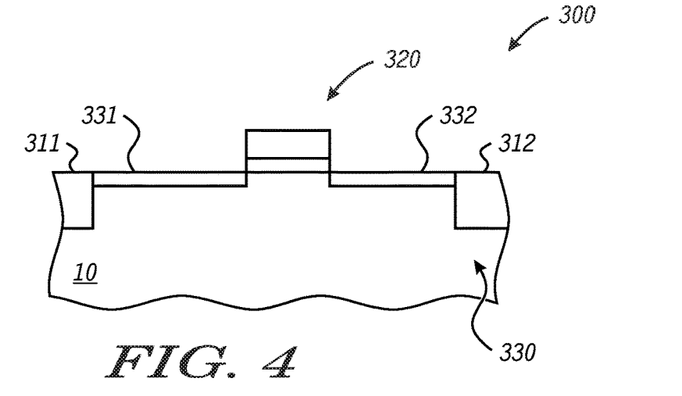

FIG. 4 is a side view of location 300 after formation of low-density n-doped regions 331 and 332 at the drain and source regions of the gate structure 320, respectively. The term "low-density" as used herein with respect to source and drain doping is intended to indicate a dopant concentration that is less than a subsequently formed source/drain dopant concentration by an order of magnitude or greater. For example, the low-density n-doped regions 331 and 332 can have an n-type dopant concentration in the range of 1e16 to 1e18 atoms/cm^3, to a depth of no more than 0.2 um, such as from about 0.1 to 0.2 um.

Figure 5:
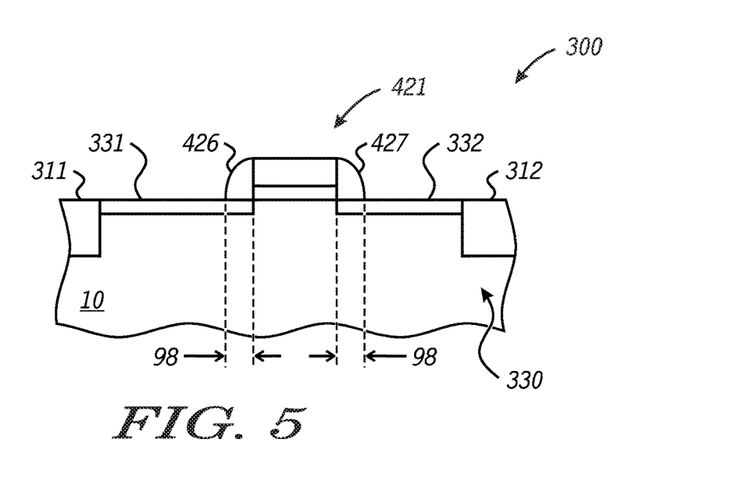

FIG. 5 is a side view of location 300 having a gate structure 421 after formation of insulating gate sidewall spacers 426 and 427. According to an embodiment, each of the gate sidewall spacers 426 and 427 has the length dimension 98. It will be appreciated that the length dimension of the gate sidewall spacers 426 and 427 ultimately define the length of the low-density n-type regions adjacent the channel regions of the logic transistors (FIG. 7) used to implement the other circuits 112. The low-density n-doped regions that remain adjacent the channel regions of the logic transistors provide a reduced doping gradient that facilitates a lower electric field in the drain near the channel region during operation that helps control drain-substrate breakdown. Thus, the dimension 98 of the gate sidewalls can be selected to optimize various characteristics and reliability of the logic transistors in the other circuits 112 portion of device 100 that are being formed in parallel with the ggNMOS transistor using the same process, except as indicated otherwise herein. For example, the length of the dimension 99, the conductive gate length, can be about twice the length of the gate sidewall dimension 98, or more. By way of example, it is presumed the dimension 98 is about 0.055 um and dimension 99 is about 0.13 um.

Figure 6:
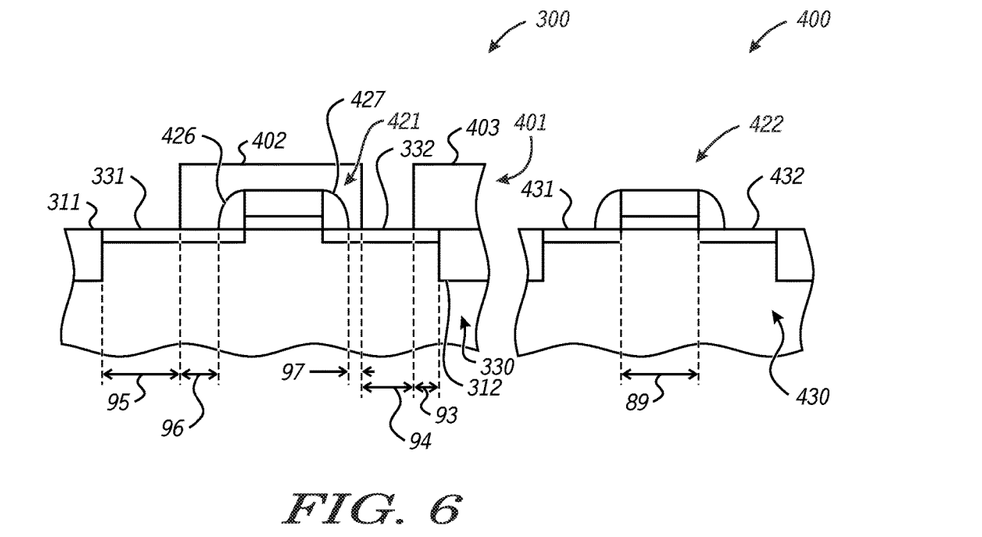

FIG. 6 is a side view of location 300 and a location 400 after formation of a mask layer 401. Location 400 is a location of the semiconductor die where a logic transistor 422 of the other circuits 112 is being simultaneously formed at the same die as the ggNMOS transistor at location 300. According to particular embodiment, the gate length of the logic transistor 422 is the dimension 89, which can be less than the length of the ggNMOS transistor. For example, a ratio of the dimension 99 to the dimension 89 can be about 1.3:1. No material of mask layer 401 resides over the source/drain regions of the logic transistor 422, thus allowing the length of the remaining portions of low-doped regions 431 and 432 to be defined by the length of the gate sidewall spacers of logic transistor 422. Mask layer 401 is chosen to be selectively removable relative the gate structure 421 and features formed at substrate 10. Mask layer 401 is further chosen to prevent n-type dopants from a subsequent source/drain implant from reaching underlying regions of the active region 330. The mask 401 can also be referred to as an n-block region.

Mask 401 includes portions that block subsequent dopant implantations, and therefore defines openings where subsequent source/drain regions will be formed having a higher n-type dopant density than that of the low-density n-doped regions 331 and 332. The location of a subsequent source/drain implant at the drain-side of the ggNMOS device is defined by the portion of the active region 330 to the left gate structure 321 that is not covered by mask portion 402, an n-block region, which overlies the conductive gate 421. Also, the location of the subsequent source/drain implant at the source-side of the ggNMOS device is defined by the uncovered portion of the active region 330 between mask portions 402 and 403. The mask portion 402 extends a length dimension 96 from the edge of the drain-side sidewall spacer 426 of gate structure 421, and extends a length dimension 97 from edge of the source-side sidewall spacer 427. The dimensions 96 and 97 can be selected to be the same or different. According to an embodiment, the dimensions 96 and 97 are about 0.21 um, for a conductive gate having a length of about 0.13 um, though it will be appreciated this value can be greater or smaller depending upon a particular process. According to an embodiment, the dimension 96 and 97 can be about the same as the dimension 98. A ratio of the combined dimension of the length of the gate sidewall spacer 426 and dimension 96 to the dimension 99 can be greater than about 1.5:1.

Figure 7:
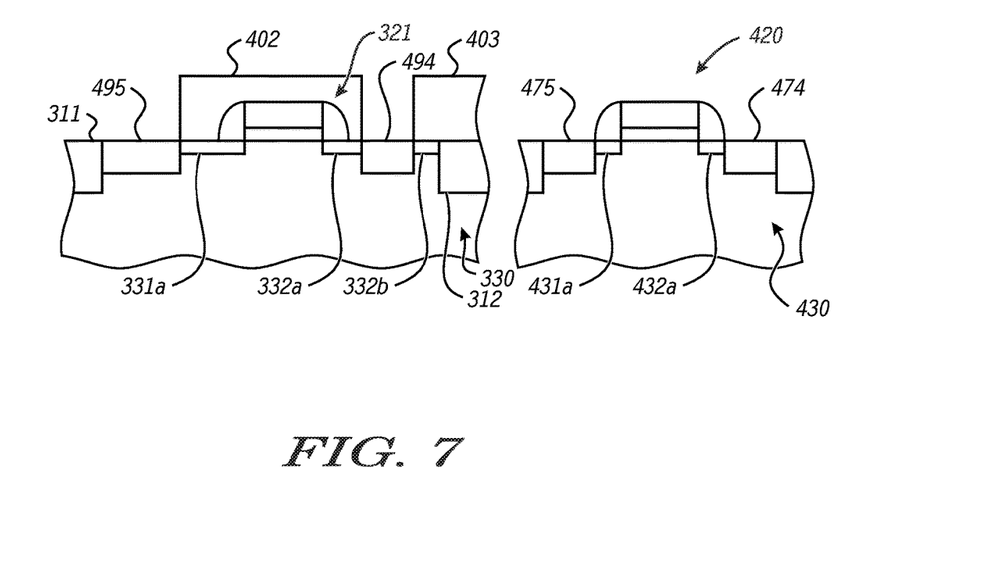
Figure 8:
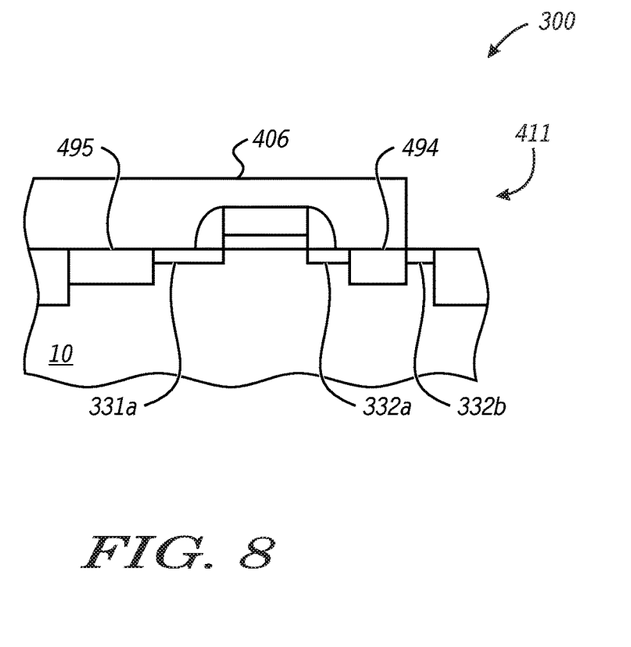

A length dimension 95 from the edge of the mask portion 402 to the dielectric region 311 ultimately defines the subsequent location of a normally-doped drain region 495, as illustrated at FIG. 7. The dimension 95 can be a critical dimension or greater, such as 0.24 um for a particular supporting a minimum gate length of about 0.13 um. Similarly, a length dimension 94 from the edge of the mask portion 402 to the mask portion 403 defines the ultimate the location of a normally-doped source region 494, as illustrated at FIG. 7. The dimension 94 can be a critical dimension or greater, such as 0.24 um, for a process supporting a minimum gate length of about 0.13 um. A length dimension 93 of the active region 330 underlying the n-block region 403 defines a location where a p-type contact will ultimately be formed, and can be a critical dimension or greater, such as 0.24 um, for a particular process supporting a minimum gate length of about 0.13 um. The source/drain dopant concentration of normally-doped source region 494 and normally-doped drain region 495 (FIG. 7) can be in the range of 1e18 to 1e20 atoms/cm^3, and have a depth greater than that of the low-doped regions 331 and 332, such as a depth of about 0.3-0.5 um. Because the n-type dopant concentration of drain regions 494 and 495 are significantly greater, e.g., at least an order of magnitude greater, than that of the low-density n-doped regions 331 and 332, only portions 331a, 332a, and 332b of the original region 331 and 332 are illustrated to remain subsequent to the source/drain implant. Note that the location of the normally-doped source and drain regions 474 and 475 at the location 400 where the logic transistor is being formed is defined by the length of the sidewall spacers of the transistor structure 420, and not by the mask layer 401. A length dimension 93 where a body contact can be formed, can FIG. 8 is a side view of location 300 after removal of mask layer 401, and formation of a mask layer 406 that facilitates formation of a p-type contact region 493 (FIG. 9) to the p-type active region 330. According to an embodiment, the p-type contact region 493 has a dopant concentration in the range of 1e19 atoms/cm^3, or greater.

Figure 9:
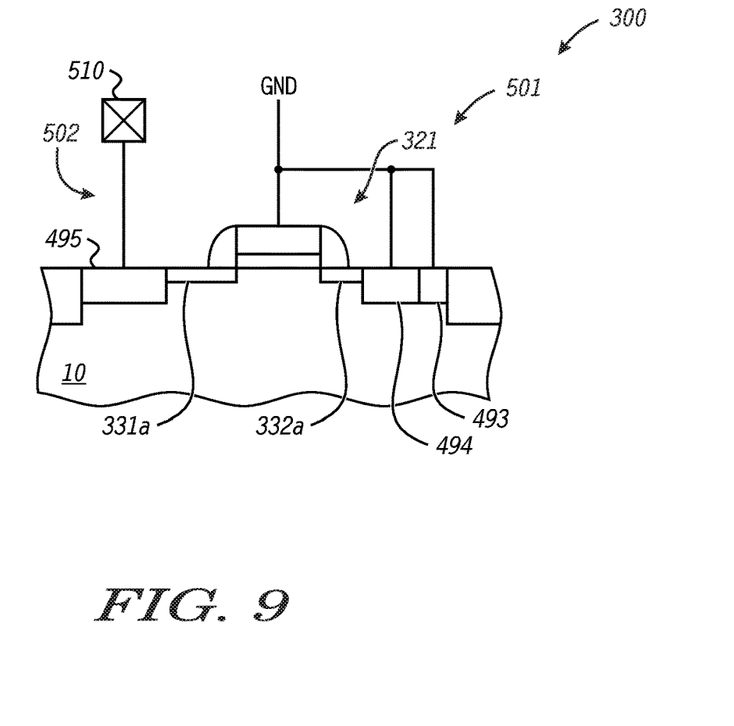

FIG. 9 is a side view of location 300 after formation of the p-type contact region 493 and removal of mask layer 406. In addition, FIG. 9 schematically illustrates the ggNMOS transistor after formation of interconnect structures 501 and 502, and a bond pad 511. It will be appreciated that the actual interconnect structure 501 is formed from various process techniques used to form conductive routing, contact, and via layers that electrically connect the conductive gate 321, the ground power rail, and the body contact 493. The interconnect structure 502 includes various routing, contact, and via layers that electrically connect the conductive drain regions to the bond pad 511.

Figure 10:
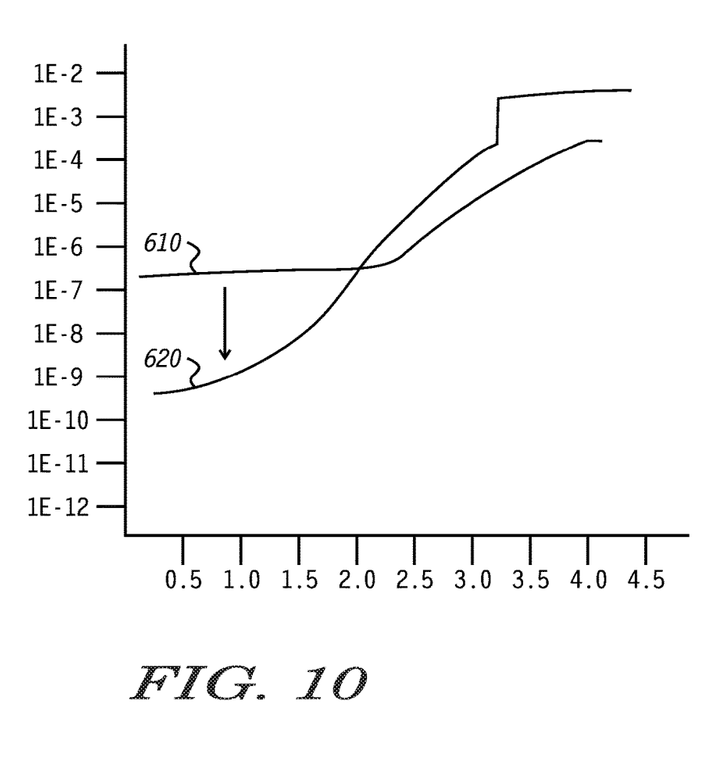
FIG. 10 illustrates a current-to-voltage graph representative of the protection device.

By moving the low-density doped region away from the sidewall spacers of the ggNMOS device a significant improvement in leakage current can be realized. For example, for a transistor having a gate length of 0.13 um and a gate width of 920 um, extending the low-density n-doped regions beyond the sidewall spacers by about 0.3 um can result in an improvement in leakage current of up to 5 or 6 orders of magnitude as compared to a similarly sized logic transistor not having the low-density n-doped region extended beyond its sidewall. The present technique is also advantageous over conventional solutions that reduce leakage current of the ggNMOS devices by implementing FETs having gate lengths that are significantly larger than that of the logic gates. For example, FIG. 10 illustrates a current-voltage curve 610 for ggNMOS device having a gate length of 0.38 um that does not use the present technique, e.g., the low-density doped drain region is aligned to the gate sidewall spacers, and a current-voltage curve 620 for ggNMOS device having a gate length of 0.13 um that does use the present technique. Despite the more favorable length of the transistor represented by curve 610, the transistor represented by curve 620 that implements the technique disclosed herein shows an improvement in leakage current of up to about orders of magnitude at supply voltage below about 1.5 volts.

The present invention has been described with respect to particular embodiments and with reference to certain drawings but the invention is not limited thereto but only by the claims. The drawings and their written description are only representative and are non-limiting. In the drawings, the size of some of the elements may be exaggerated and not drawn on scale for illustrative purposes. For example, it will be appreciated that while device 100 has been described as using n-type ggFETs, similar techniques can be used to configure a p-type FET as one or both of diodes 106 and 108. Thus, the term "ggFET" as used herein with reference to a transistor is intended to refer to either an n-type FET having its gate, source, and body electrically connected to form the anode of a diode, while its drain forms the cathode, or to a p-type FET having its gate, source, and body electrically connected to form the cathode of a diode, while its drain forms the anode. Typically, the use of an n-type ggFETs can be advantageous, as n-type ggFETs can typically be implemented in a smaller area for a given performance that a p-type ggFET.

According to a first aspect, a device includes an input/output (IO) bond pad and an electro-static discharge device. The Electro-Static Discharge (ESD) device having a first terminal connected to the bond pad, and further includes a field-effect transistor having a gate structure having a conductive gate and a sidewall spacer, a length of the sidewall spacer being a first length dimension, the gate structure overlying an active region. The active region including a channel region formed at a body having a first conductivity type, a first drain region having a second conductivity type, a first depth dimension, and a first dopant concentration, electrically connected to the 10 bond pad, a first source region having the second conductivity type electrically connected to the conductive gate and to the body, and a second drain region having the second conductivity type, a second depth dimension that is less than the first depth dimension, and a second dopant concentration that is less than the first dopant concentration of the first drain region, the second drain region separating, and abutting, the first drain region and the channel region by a second length dimension that is greater than the first length dimension.

In one embodiment of the first aspect, a ratio of the second length dimension to the first length dimension is at least 2:1. In a more particular embodiment of the one embodiment, the length of the first length dimension is about 0.055 um. In another more particular embodiment of the one embodiment, the length of the second length dimension is greater than 0.21 um. In still another more particular embodiment of the one embodiment, a ratio of the first dopant concentration to the second dopant concentration is at least 10:1. In yet another more particular embodiment of the one embodiment, a ratio of the first depth dimension to the second depth dimension is at least 2:1. In a more particular embodiment of the yet another more particular embodiment, a ratio of the first dopant concentration to the second dopant concentration is at least 10:1.

In another embodiment of the first aspect, a ratio of the first dopant concentration to the second dopant concentration is at least 10:1. In a further embodiment of the first aspect, a length of the conductive gate is less than the second length dimension. In a more particular embodiment of the further embodiment of the first aspect, a ratio of the second length dimension to the length of the conductive gate is greater that 1.5:1. In yet a further embodiment of the first aspect, the active region further includes a second source region having the second conductivity type, the second depth dimension, and a dopant concentration that is less than the dopant concentration of the first source region.

In a second aspect, a method includes forming a first conductive gate, forming a first drain-side gate sidewall spacer, forming a first drain region, forming a second drain region, forming a first electrical connection, and forming a second electrical connection. Forming the first conductive gate includes forming the first conductive gate at a first location of a first active region of a semiconductor substrate where a gate-grounded field-effect transistor (ggFET) having a channel region of a first conductivity type is being formed. Forming the first drain-side gate sidewall spacer includes forming the sidewall spacer to abut a first sidewall of the first conductive gate, and the first drain-side gate sidewall spacer having a first length dimension. Forming a first drain region of the ggFET includes forming the first drain region to have a second conductivity type, a first depth dimension, and a first dopant concentration, the first drain region having a second length dimension, as measured from the first sidewall of the first conductive gate, that is greater than the first length dimension of the first drain-side gate sidewall spacer. Forming the second drain region of the ggFET includes forming the second drain region of the ggFET to have the second conductivity type, a second depth dimension and a second dopant concentration, the second depth dimension being greater than the first depth dimension, the second dopant concentration being greater than the first dopant concentration, and the first drain region being between the second drain region and a channel region of the ggFET. Forming the first electrical connection includes forming the first electrical connection from an input/output bond pad to the second drain region of the ggFET. Forming the second electrical connection includes forming the second electrical connection between the first conductive gate, a source of the ggFET, and a body of the first active region.

In one embodiment of the second aspect, the method further includes forming a second conductive gate of a FET, a second drain-side gate of the FET, a first drain region of the FET, and a second drain region of the FET. Forming the second conductive gate occurs at a second location of a second active region of the first conductivity type of the semiconductor substrate where the field-effect transistor (FED is being formed simultaneously with the ggFET. Forming the second drain-side gate sidewall spacer includes the second drain-side gate sidewall spacer abutting a first sidewall of the second conductive gate, the second drain-side gate sidewall spacer having the first length dimension; Forming the first drain region of the FET includes the first drain region having the first depth dimension and the first dopant concentration, the first drain region of the FET having the first length dimension, as measured from the first sidewall of the first conductive gate of the FET. Forming the second drain region of the FET having the second depth dimension and the second dopant concentration, the first drain region of the FET being between the second drain region and a channel region of the FET. In a more particular embodiment of the one embodiment, a first electrical connections is formed from the input/output bond pad to the second drain region of the FET. In another more particular embodiment of the one embodiment, the second length dimension is at least twice the first length dimension. In an even more particular embodiment of the another more particular embodiment, the second depth dimension is at least twice the first depth dimension. A still even more particular embodiment of the even more particular embodiment, further includes: forming a first source-side gate sidewall spacer abutting a second sidewall of the first conductive gate of the ggFET, the first source-side gate sidewall spacer having the first length dimension; forming a first source region of the ggFET having the first depth dimension and the first n-dopant concentration, the first source region having the first length dimension as measured from the second sidewall of the conductive gate of the ggFET; and forming a second source region of the source of the ggFET having the second depth dimension and the second dopant concentration, and the first source region being between the second source region and a channel region of the ggFET. In another still event more particular embodiment of the still even more particular embodiment, a ratio of the second dopant concentration to the first dopant concentration is at least 10:1. In another embodiment of the second aspect, the second length dimension is greater than a length dimension of the conductive gate.

The terms "substantially", "about", and their variants, as used herein are intended to refer to the qualified article being sufficient to achieve the stated purpose or value in a practical manner, which includes taking into account any minor imperfections or deviations, if any, that arise from usual and expected abnormalities that may occur during device operation, which are not significant for the stated purpose or value. In addition, the term "substantially" has further been defined herein in the context of specific attributes to identify specific ranges.

LIST OF REFERENCE SIGNS

89: dimension;
93: length dimension;
94: dimension/length dimension;
95: dimension/length dimension;
96: dimension/length dimension;
97: dimension/length dimension;
98: dimension/length dimension;
99: dimension/length dimension;
100: electronic application device/device/FET;
102: VDD power supply rail/power supply rail;
104: ground power supply rail/power supply rail;
106: diode/upper diode/ESD diode;
108: diode/lower diode;
110: bond pad;
111: signal line/conductive line;
112: other circuits/circuits;
206: transistor/n-type FET;
208: transistor/n-type FET;
300: location;
311: dielectric portion/dielectric region;
312: dielectric portion;
320: gate structure;
321: gate structure/conductive gate/left gate structure;
322: gate dielectric;
330: body region/active region/p-type active region;
331: low-density n-doped region/low-doped region/original region;
332: low-density n-doped region/low-doped region/original region;
400: location;
401: mask layer;
402: mask portion/n-bock region;
403: mask portion/n-block region;
406: mask layer;
420: transistor structure;
421: gate structure/conductive gate;
422: logic transistor;
426: gate sidewall spacer/drain-side sidewall spacer;
427: gate sidewall spacer/source-side sidewall spacer;
431: low-doped region;

432: low-doped region;
474: normally-doped drain region;
475: normally-doped drain region;
493: p-type contact region/body contact;
494: normally-doped source region/source region/region;
495: normally-doped drain region/source region/region;
501: interconnect structure;
502: interconnect structure;
511: bond pad;
610: current-voltage curve/curve;
620: current-voltage curve/curve;

LIST OF TERMS active region: 330;
body contact: 493;
body region: 330;
bond pad: 110, 511;
circuits: 112;
conductive gate: 321, 421;
conductive line: 111;
current-voltage curve: 610, 620;
curve: 610, 620;
device: 100;
dielectric portion: 311, 312;
dielectric region: 311;
dimension: 89, 94, 95, 96, 97, 98, 99;
diode: 106, 108;
drain-side sidewall spacer: 426;
electronic application device: 100;
ESD diode: 106;
FET: 100;
gate dielectric: 322;
gate sidewall spacer: 426, 427;
gate structure: 320, 321, 421;
ground power rail: 104;
interconnect structure: 501, 502;
left gate structure: 321;
length dimension: 93, 94, 95, 96, 97, 98, 99;
location: 300, 400;
logic transistor: 422;
low-density n-doped region: 331, 332;
low-doped region: 331, 332, 431, 432;
lower diode: 108;
mask layer: 401, 402, 406;
mask portion: 402, 403;
n-block region: 403;
normally-doped drain region: 474, 475, 495;
normally-doped source region: 494;
n-type FET: 208;
original region: 331, 332;
other circuits: 112;
power supply rail: 102;
p-type FET: 206;
p-type active region: 330;
p-type contact region: 493;
region: 494, 495;
signal line: 111;
source region: 494, 495;
source-side sidewall spacer: 427;
transistor: 206, 208;
transistor structure: 420;
upper diode: 106;
VDD power rail: 102;

What is claimed is:

1. A device comprising:
   an input/output (IO) bond pad of an electronic device;
   an Electro-Static Discharge (ESD) device having a first terminal connected to the bond pad, the ESD device including:
   a field-effect transistor having a gate structure having a conductive gate and a sidewall spacer, a length of the sidewall spacer being a first length dimension, the gate structure overlying an active region, the active region including:
   a channel region formed at a body having a first conductivity type;
   a first drain region having a second conductivity type, a first depth dimension, and a first dopant concentration, electrically connected to the bond pad;
   a first source region having the second conductivity type electrically connected to the conductive gate and to the body; and
   a second drain region having the second conductivity type, a second depth dimension that is less than the first depth dimension, and a second dopant concentration that is less than the first dopant concentration of the first drain region, the second drain region separating; and abutting, the first drain region and the channel region by a second length dimension that is greater than the first length dimension.

2. The device of claim 1, wherein a ratio of the second length dimension to the first length dimension is at least 2:1.

3. The device of claim 2, wherein the length of the first length dimension is about 0.055 µm.

4. The device of claim 2, wherein the length of the second length dimension is greater than 0.21 µm.

5. The device of claim 2, wherein a ratio of the first dopant concentration to the second dopant concentration is at least 10:1.

6. The device of claim 2, wherein a ratio of the first depth dimension to the second depth dimension is at least 2:1.

7. The device of claim 6, wherein a ratio of the first dopant concentration to the second dopant concentration is at least 10:1.

8. The device of claim 1, wherein a ratio of the first dopant concentration to the second dopant concentration is at least 10:1.

9. The device of claim 1, wherein a length of the conductive gate is less than the second length dimension.

10. The device of claim 9, wherein a ratio of the second length dimension to the length of the conductive gate is greater that 1.5:1.

11. The device of claim 1, wherein the active region further comprises:
    a second source region having the second conductivity type, the second depth dimension, and a dopant concentration that is less than the dopant concentration of the first source region.

12. A method comprising:
    forming a first conductive gate at a first location of a first active region of a semiconductor substrate where a gate-grounded field-effect transistor (ggFET) having a channel region of a first conductivity type is being formed;
    forming a first drain-side gate sidewall spacer abutting a first sidewall of the first conductive gate, the first drain-side gate sidewall spacer having a first length dimension;
    forming a first drain region of the ggFET having a second conductivity type, a first depth dimension, and a first dopant concentration, the first drain region having a second length dimension, as measured from the first sidewall of the first conductive gate, that is greater than the first length dimension of the first drain-side gate sidewall spacer;

forming a second drain region of the ggFET having the second conductivity type, a second depth dimension and a second dopant concentration, the second depth dimension being greater than the first depth dimension, the second dopant concentration being greater than the first dopant concentration, and the first drain region being between the second drain region and a channel region of the ggFET;

forming a first electrical connection from an input/output bond pad to the second drain region of the ggFET; and forming a second electrical connection between the first conductive gate, a source of the ggFET, and a body of the first active region.

13. The method of claim 12 further comprising:

forming a second conductive gate at a second location of a second active region of the first conductivity type of the semiconductor substrate where a field-effect transistor (FET) is being formed simultaneously with the ggFET;

forming a second drain-side gate sidewall spacer abutting a first sidewall of the second conductive gate, the second drain-side gate sidewall spacer having the first length dimension;

forming a first drain region of the FET having the first depth dimension and the first dopant concentration, the first drain region of the FET having the first length dimension, as measured from the first sidewall of the first conductive gate of the FET; and forming a second drain region of the FET having the second depth dimension and the second dopant concentration, the first drain region of the FET being between the second drain region and a channel region of the FET.

14. The method of claim 13 further comprising:

forming a first electrical connection from the input/output bond pad to the second drain region of the FET.

15. The method of claim 13, wherein the second length dimension is at least twice the first length dimension.

16. The method of claim 15, wherein the second depth dimension is at least twice the first depth dimension.

17. The method of claim 16 further comprising:

forming a first source-side gate sidewall spacer abutting a second sidewall of the first conductive gate of the ggFET, the first source-side gate sidewall spacer having the first length dimension;

forming a first source region of the ggFET having the first depth dimension and the first n-dopant concentration, the first source region having the first length dimension as measured from the second sidewall of the conductive gate of the ggFET; and forming a second source region of the source of the ggFET having the second depth dimension and the second dopant concentration, and the first source region being between the second source region and a channel region of the ggFET.

18. The method of claim 17, wherein a ratio of the second dopant concentration to the first dopant concentration is at least 10:1.

19. The method of claim 12, wherein the second length dimension is greater than a length dimension of the conductive gate.

* * * * *